(12) United States Patent
Hayashi et al.

(10) Patent No.: US 7,566,874 B2
(45) Date of Patent: Jul. 28, 2009

(54) INFRARED SENSOR AND ITS MANUFACTURING METHOD

(75) Inventors: Koji Hayashi, Kyoto (JP); Dai Sasaki, Hakui (JP)

(73) Assignee: Murata Manufacturing Co. Ltd., Kyoto (JP)

( * ) Notice: Subject to any disclaimer, the term of this patent is extended or adjusted under 35 U.S.C. 154(b) by 0 days.

(21) Appl. No.: 11/937,261

(22) Filed: Nov. 8, 2007

(65) Prior Publication Data

US 2008/0251722 A1    Oct. 16, 2008

Related U.S. Application Data

(63) Continuation of application No. PCT/JP2006/308341, filed on Apr. 20, 2006.

(30) Foreign Application Priority Data

| May 11, 2005 | (JP) | ............................. | 2005-138986 |
| Feb. 20, 2006 | (JP) | ............................. | 2006-043010 |

(51) Int. Cl.
    *G01J 5/00*    (2006.01)
(52) U.S. Cl. ................................. 250/338.1
(58) Field of Classification Search ... 250/269.1–269.8, 250/338.1
    See application file for complete search history.

(56) References Cited

U.S. PATENT DOCUMENTS 5,962,854 A    10/1999    Endo

2003/0098912 A1    5/2003    Hosokai et al.

FOREIGN PATENT DOCUMENTS

| EP | 0775895 A | * | 11/1995 |
| JP | 57064709 A | * | 4/1982 |
| JP | 58-175878 A | | 10/1983 |
| JP | 06-018654 A | | 1/1994 |
| JP | 06-201454 A | | 7/1994 |
| JP | 06-80139 U | | 11/1994 |
| JP | 07190852 A | * | 7/1995 |
| JP | 2004-170214 A | | 6/2004 |

OTHER PUBLICATIONS

Official communication issued in the International Application No. PCT/JP2006/308341, mailed on Aug. 1, 2006.

\* cited by examiner

*Primary Examiner*—David P Porta
*Assistant Examiner*—Kiho Kim
(74) *Attorney, Agent, or Firm*—Keating & Bennett, LLP

(57) ABSTRACT

An infrared sensor has a groove formed at a peripheral portion of an optical filter in a region opposed to a circumferential region of an opening of a package so as to be continuously located in the peripheral portion of the optical filter. The optical filter has a resistance of about 1 MΩ/cm or less. The package is mainly composed of a metal material. A conductive adhesive is used as an adhesive for joining the optical filter to the package. In a case where the optical filter has a filter body and a thin film made of an insulating material and provided on a surface of the filter body, the groove is formed to have a depth extending from the surface provided with the thin film made of the insulating material to the filter body.

7 Claims, 15 Drawing Sheets

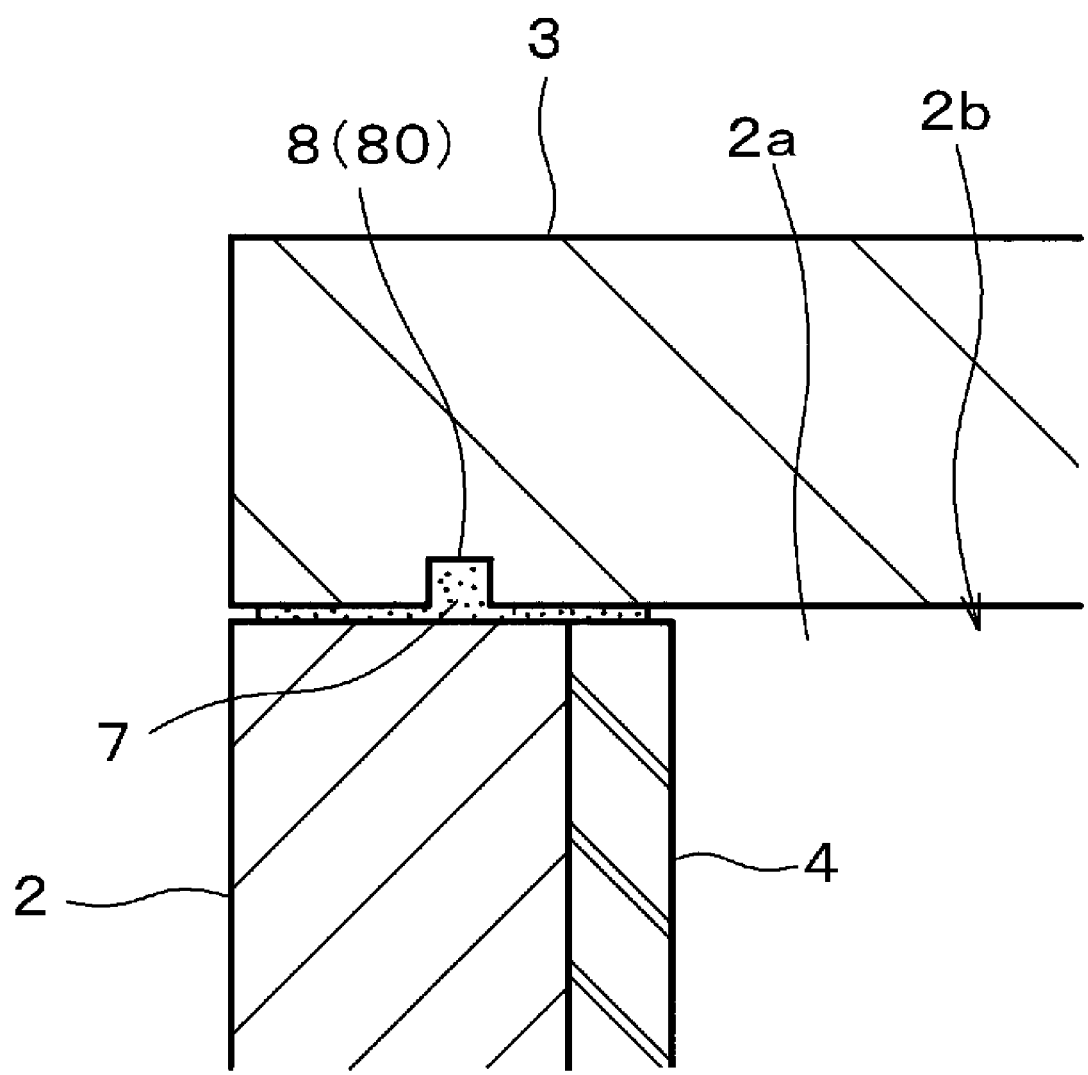

INFRARED SENSOR AND ITS MANUFACTURING METHOD

BACKGROUND OF THE INVENTION

1. Field of the Invention

The present invention relates to an infrared sensor and its manufacturing method, the infrared sensor having a configuration in which an infrared sensor element is accommodated in a package. More particularly, the present invention relates to an infrared sensor and its manufacturing method, the infrared sensor having a configuration in which an infrared sensor element is accommodated in a sealed space defined by a package and an optical filter which also serves as a cover.

2. Description of the Related Art

As shown in FIGS. 16A and 16B, a known infrared sensor is disclosed. See, for example, Japanese Unexamined Patent Application Publication No. 6-201454. The infrared sensor has a configuration in which an infrared sensor element 54 is accommodated in a sealed space 53 defined by a container body 51 and a stem 52, and a filter (window member) 57 is disposed at an upper surface of the container body 51. The filter (window member) 57 has a substrate 55 and infrared filter layers 56a and 56b on upper and lower primary surfaces of the substrate 55 so as to transmit infrared radiation with a predetermined wavelength.

In such an infrared sensor, as shown in FIG. 16B, a step 57a is provided at a peripheral portion of a lower surface of the filter 57. The step 57a is engaged with an opening 58 formed at the upper surface of the container body 51, and then, a metal thin film 59 which is provided on a surface of the step 57a of the filter 57 by sputtering is joined to the opening 58 of the container body 51 by using a solder 60, so that the filter 57 is attached to the opening 58 of the container body 51.

However, with the method described in Japanese Unexamined Patent Application Publication No. 6-201454, as shown in FIG. 16B, the metal thin film 59 is required to be provided on the surface of the step 57a by sputtering or the like after the step 57a is formed at the peripheral portion of the filter 57. This may cause the manufacturing procedure to be complicated, resulting in an increase in cost.

In addition, when the metal thin film 59 provided on the step 57a of the filter 57 is joined to the opening 58 of the container body 51 by using the solder 60, it is difficult to distribute the solder 60 so as to be continuously located in the peripheral portion of the opening 58 of the container body 51 for reliably joining the filter 57 to the container body 51. If the solder 60 is distributed unevenly at a gap between the step 57a and the opening 58 of the container body 51, the solder 60 may flow to the infrared filter layer 56b provided at the lower surface of the filter 57 (namely, to a center region of the infrared filter layer 56a), thereby degrading its reliability, such as that a field of view is narrowed.

As shown in FIG. 17, another infrared sensor is suggested. See, for example, Japanese Unexamined Patent Application Publication No. 10-318829. The infrared sensor has a configuration in which a step 63 is formed to be continuously arranged in a circumferential portion of an opening 62 of a ceramic package 61, and a cover 65 is fitted to the step 63. The cover 65 has an infrared sensor element 64 attached to a lower surface, and an infrared-insulating film 68 attached to an upper surface in a region not occupied by a window 67 so that only a portion (the window) 67 can transmit the infrared radiation. A filler 66 such as epoxy resin is injected to a gap between the cover 65 and the opening 62 of the ceramic package 61, and then the cover 65 is attached to the ceramic package 61.

However, with the method of Japanese Unexamined Patent Application Publication No. 10-318829, the filler 66 is not applied sufficiently to the gap between opposed surfaces of the cover 65 and ceramic package 61, resulting in unstable sealing.

If the filler 66 is sufficiently applied to the gap between the opposed surfaces of the cover 65 and ceramic package 61, the filler 66 may flow to a central region at the lower surface of the cover 65.

SUMMARY OF THE INVENTION

In order to overcome the problems described above, preferred embodiments of the present invention provide a highly reliable infrared sensor and its manufacturing method, the infrared sensor having a configuration capable of enhancing a reliability of joining an optical filter to a package without requiring a complicated structure or a complicated manufacturing procedure, and without causing a problem that an adhesive flows to a region interfering with the field of view of the optical filter. Further, preferred embodiments of the present invention provide an infrared sensor and its manufacturing method, the infrared sensor having an excellent electromagnetic-shielding performance and a reliable electromagnetic-wave-proof characteristic.

An infrared sensor according to a preferred embodiment of the present invention includes an infrared sensor element; a package for surface mounting and having a box-like shape with an opening formed at a surface, the package being configured to accommodate the infrared sensor element therein; and an optical filter configured to transmit infrared radiation with a predetermined wavelength, the optical filter being arranged to cover the opening of the package, a peripheral portion of the optical filter being joined to a circumferential region of the opening of the package by an adhesive, the optical filter providing a function of allowing the infrared sensor element to receive the infrared radiation with the predetermined wavelength and a function as a cover to seal the opening. A groove is formed at the peripheral portion of the optical filter in a region opposed to the circumferential region of the opening of the package so as to surround the optical filter.

The optical filter preferably has a resistance of about 1 MΩ/cm or less, the package is mainly composed of a metal material, and the adhesive for joining the optical filter to the package is a conductive adhesive, and the optical filter is electrically connected to the package with the conductive adhesive interposed therebetween.

The optical filter preferably has a filter body and a thin film, the filter body providing the function of allowing the infrared sensor element to receive the infrared radiation with the predetermined wavelength and the function as the cover to seal the opening, the thin film being made of an insulating material and provided on a surface of the filter body. The groove continuously located in the peripheral portion of the optical filter extends from the surface provided with the thin film made of the insulating material to the filter body.

The circumferential region of the opening of the package is preferably fitted to the groove continuously located in the peripheral portion of the optical filter.

A method of manufacturing an infrared sensor according to another preferred embodiment preferably includes the steps of forming a plurality of grooves at a mother optical filter that contains a plurality of the optical filters corresponding to a plurality of the infrared sensors, the grooves becoming a plurality of the grooves continuously located in a plurality of the peripheral portions of the optical filters after being divided; applying the adhesive at the grooves and the vicinities thereof; placing a plurality of the packages that accommodate a plurality of the infrared sensor elements on the mother optical filter such that a plurality of the circumferential regions of a plurality of the openings come into contact with the adhesive applied at the grooves and the vicinities thereof, and bonding and fixing the packages to the mother optical filter by the adhesive; and dividing the mother optical filter at predetermined positions so as to obtain the individual infrared sensors.

Another method of manufacturing an infrared sensor according to another preferred embodiment preferably includes the steps of forming a plurality of grooves at a mother optical filter that contains a plurality of the optical filters corresponding to a plurality of the infrared sensors, the grooves becoming a plurality of the grooves continuously located in a plurality of the peripheral portions of the optical filters after being divided; placing a plurality of the packages that accommodate a plurality of the infrared sensor elements on the mother optical filter such that a plurality of the circumferential regions of a plurality of the openings are fitted to the grooves that become the grooves continuously located in the peripheral portions of the optical filters, and in this state, bonding and fixing the packages to the mother optical filter by the adhesive; and dividing the mother optical filter at predetermined positions so as to obtain the individual infrared sensors.

An infrared sensor according to a preferred embodiment of the present invention includes the infrared sensor element, the package for surface mounting and having the box-like shape with the opening formed at the surface, the package being configured to accommodate the infrared sensor element therein, and the optical filter configured to transmit the infrared radiation with the predetermined wavelength, the optical filter being arranged to cover the opening of the package, the peripheral portion of the optical filter being joined to the circumferential region of the opening of the package by the adhesive, the optical filter providing the function of allowing the infrared sensor element to receive the infrared radiation with the predetermined wavelength and the function as the cover to seal the opening. The groove is formed at the peripheral portion of the optical filter in the region opposed to the circumferential region of the opening of the package so as to be continuously located in the peripheral portion of the optical filter. Accordingly, the peripheral portion of the optical filter is reliably joined to the circumferential region of the opening of the package by the adhesive held at the groove.

Since the groove formed to be continuously located in the peripheral portion of the optical filter holds the adhesive, the adhesive may be reliably inhibited and prevented from flowing to the central region from the peripheral portion of the optical filter.

Therefore, the adhesive may be prevented from flowing to an unwanted region of the optical filter and from narrowing the field of view, while the optical filter may be reliably joined to the package, without requiring a complicated structure or a complicated manufacturing procedure, thereby providing an infrared sensor which is economically efficient and highly reliable.

The optical filter preferably has the resistance of about 1 MΩ/cm or less, the package is mainly composed of the metal material, and the adhesive for joining the optical filter to the package is the conductive adhesive, and the optical filter is electrically connected to the package with the conductive adhesive interposed therebetween. In this case, the infrared sensor element is accommodated in the sealed space defined by the optical filter and the package electrically connected to each other, thereby providing an infrared sensor with an excellent electromagnetic-shielding performance and a reliable electromagnetic-wave-proof characteristic.

The optical filter preferably has the filter body and the thin film, the filter body providing the function of allowing the infrared sensor element to receive the infrared radiation with the predetermined wavelength and the function as the cover to seal the opening, the thin film being made of the insulating material and provided on the surface of the filter body. Also, the groove continuously located in the peripheral portion of the optical filter extends from the surface provided with the thin film made of the insulating material to the filter body. In this case, the peripheral portion of the optical filter is reliably joined to the circumferential region of the opening of the package by the adhesive held at the groove.

Therefore, in the case where the optical filter has the filter body and the thin film made of the insulating material provided on the surface of the filter body, the adhesive may be prevented from flowing to an unwanted region of the optical filter and from narrowing the field of view, while the optical filter may be reliably joined to the package, without requiring a complicated structure or a complicated manufacturing procedure, thereby providing an infrared sensor which is economically efficient and highly reliable.

In addition, since the conductive adhesive is sufficiently held at the groove having the depth extending from the surface provided with the thin film made of the insulating material to the filter body, the optical filter may be electrically connected to the package with the conductive adhesive interposed therebetween. Accordingly, the infrared sensor element may be accommodated in the sealed space defined by the optical filter and the package electrically connected to each other, thereby providing a highly reliable infrared sensor having an excellent electromagnetic-shielding performance.

For example, the filter body that may be applied to preferred embodiments of the present invention may be made of various materials, such as monocrystal silicon, quartz, sapphire, barium fluoride, and spinel. In the present invention, however, the filter body may use other material.

In preferred embodiments of the present invention, the insulating material for the thin film may be ZnS, Ge, or the like.

The circumferential region of the opening of the package preferably is fitted to the groove continuously located in the peripheral portion of the optical filter. Accordingly, the positional accuracy may be enhanced when the optical filter is mounted on the package, moreover the positional shift after mounting may be prevented, thereby enhancing the reliability.

A method of manufacturing an infrared sensor according to according to another preferred embodiment includes the steps of forming the grooves at the mother optical filter that contains the optical filters corresponding to the infrared sensors, the grooves becoming the grooves continuously located in the peripheral portions of the optical filters after being divided, applying the adhesive at the grooves and the vicinities thereof, placing the packages that accommodate the infrared sensor elements on the mother optical filter such that the circumferential regions of the openings come into contact with the adhesive applied at the grooves and the vicinities thereof, and bonding and fixing the packages to the mother optical filter by the adhesive and dividing the mother optical filter at the predetermined positions so as to obtain the individual infrared sensors. In the manufacturing procedure, the mother optical filter serves as a tray or as a substrate for conveying the packages. Accordingly, the plurality of infrared sensors can be manufactured efficiently at one time by dividing the mother optical filter after the bonding and fixing of the packages.

A method of manufacturing an infrared sensor according to another preferred embodiment includes the steps of forming the grooves at the mother optical filter that contains the optical filters corresponding to the infrared sensors, the grooves becoming the grooves continuously located in the peripheral portions of the optical filters after being divided, placing the packages that accommodate the infrared sensor elements on the mother optical filter such that the circumferential regions of the openings are fitted to the grooves that become the grooves continuously located in the peripheral portions of the optical filters, and in this state, bonding and fixing the packages to the mother optical filter by the adhesive, and dividing the mother optical filter at the predetermined positions so as to obtain the individual infrared sensors. In the manufacturing procedure, the mother optical filter serves as a tray or as a substrate for conveying the packages. Accordingly, the plurality of infrared sensors can be manufactured efficiently at one time by dividing the mother optical filter after the bonding and fixing of the packages.

In addition, since the plurality of packages are mounted on the mother optical filter such that the circumferential regions of the openings of the packages are fitted to the grooves formed at the mother optical filter, the grooves becoming grooves continuously located in the peripheral portion of the optical filter, the positional shift may be reduced in the subsequent procedure. Accordingly, the plurality of infrared sensors can be further reliably manufactured efficiently at one time.

The packages preferably are placed on the mother optical filter such that the circumferential regions of the openings of the packages are fitted to the grooves that become the grooves continuously located in the peripheral portions of the optical filters. Therefore, the positional shift may be reduced. Thus, not only the adhesive can be applied before the packages are mounted, but also the adhesive can be applied after the packages are mounted and then the packages are bonded and fixed to the mother optical filter. This may allow the manufacturing procedure to be designed freely, and to be rationalized, thereby reducing the cost.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 3 is an illustration showing an essential structure of the infrared sensor according to the first preferred embodiment of the present invention.

DETAILED DESCRIPTION OF PREFERRED EMBODIMENTS

Features of the present invention are described below in detail with reference to preferred embodiments of the present invention.

First Preferred Embodiment

Figure 1A:
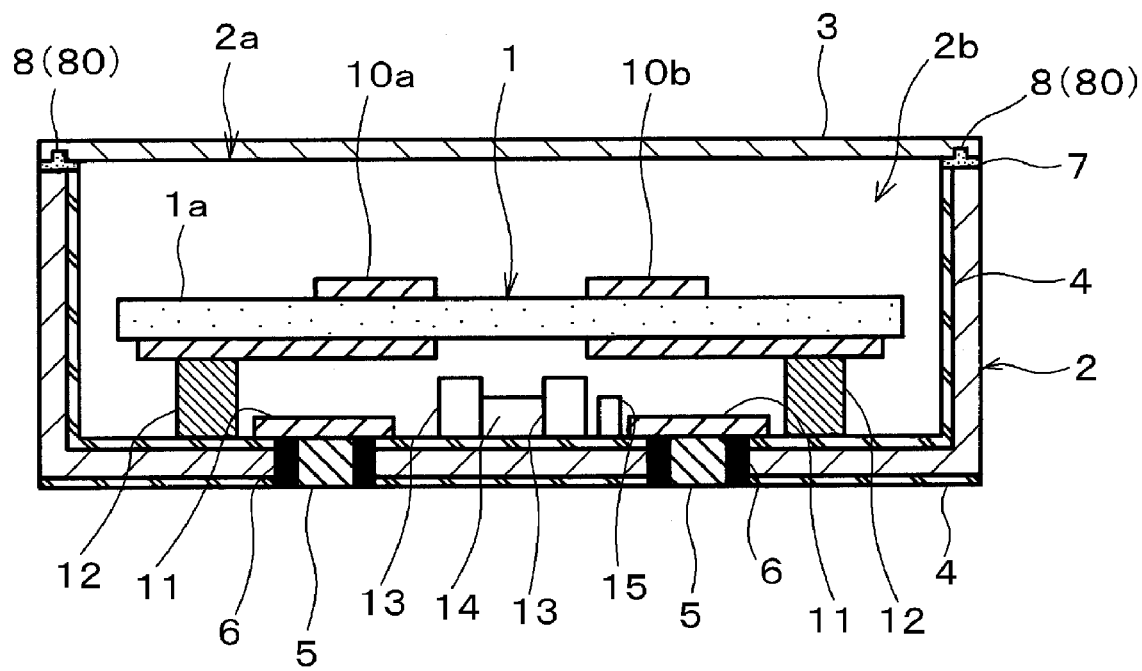
FIG. 1A is a cross-sectional view schematically showing an infrared sensor according to a first preferred embodiment of the present invention and FIG. 1B is a perspective view of the same.
Figure 1B:
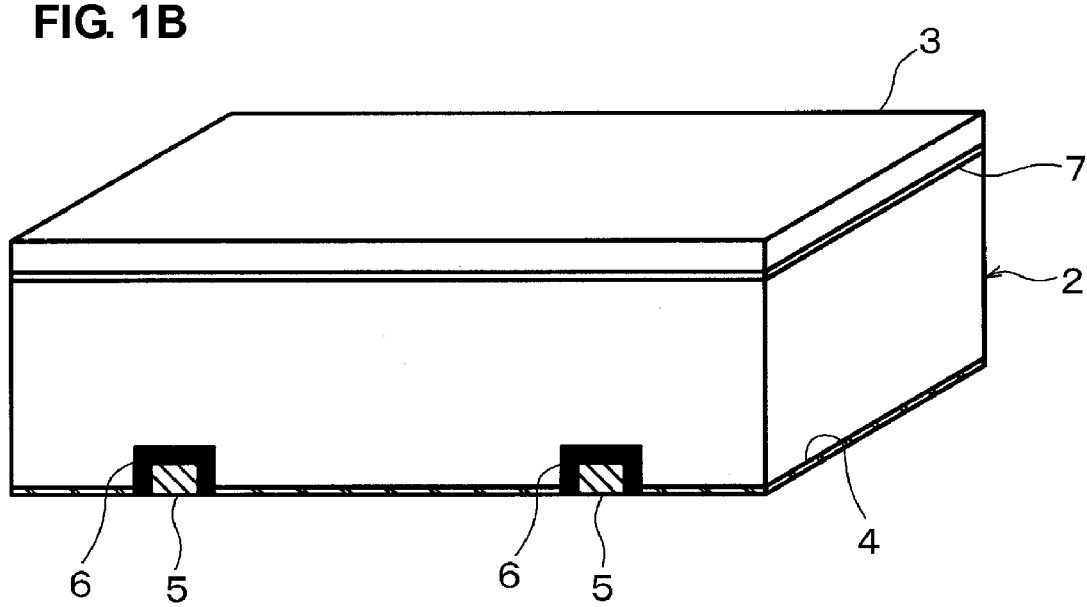
Figure 2A:
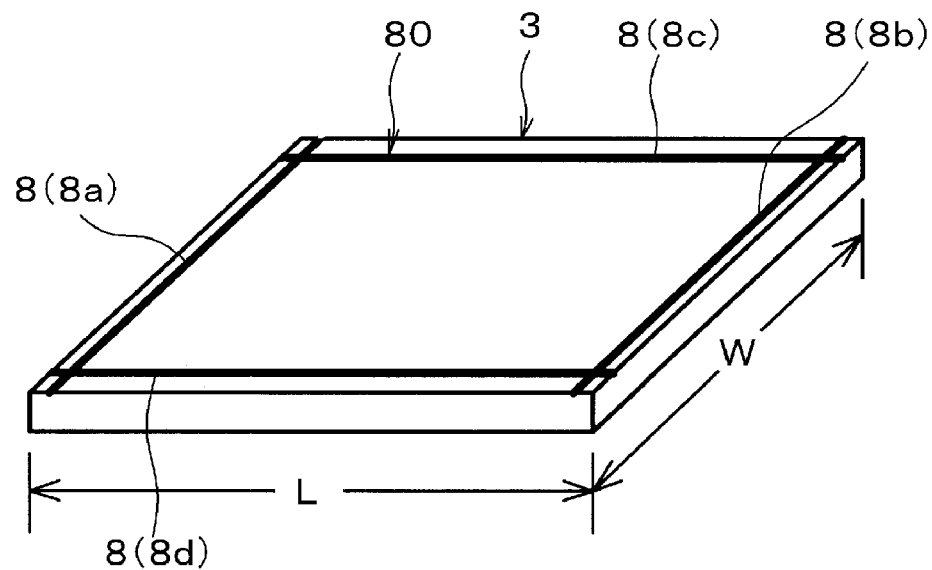
FIG. 2A is a perspective view showing a configuration of an optical filter used for the infrared sensor of the first preferred embodiment and FIG. 2B is an enlarged view of a primary portion of the same.
Figure 2B:
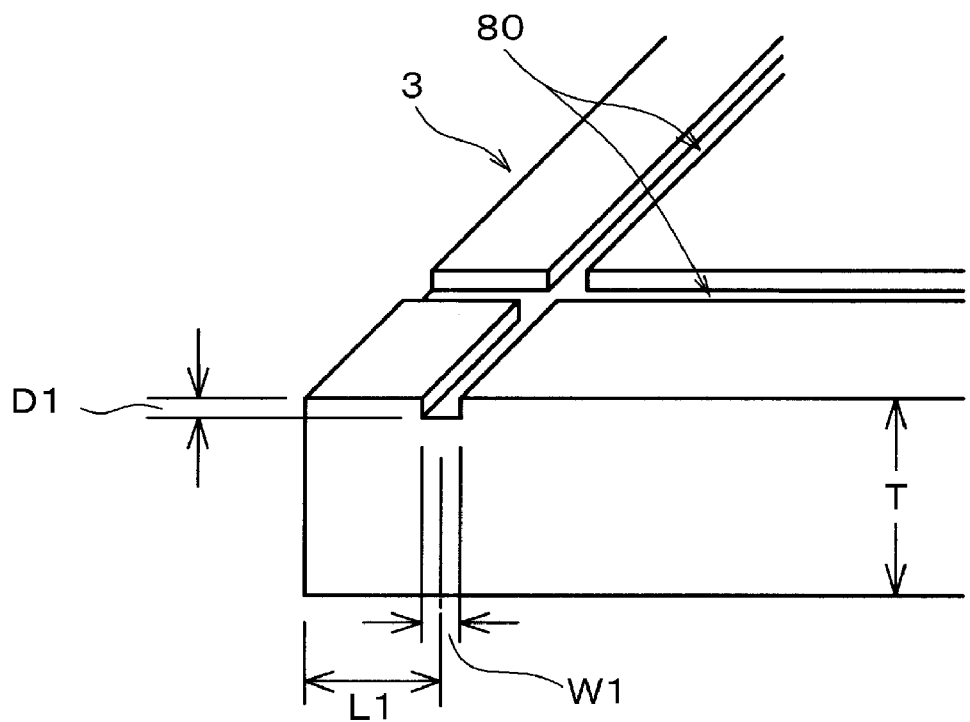

FIG. 1A is a cross-sectional view schematically showing an infrared sensor according to a first preferred embodiment of the present invention and FIG. 1B is a perspective view of the same. FIG. 2A is a perspective view showing a configuration of an optical filter used for the infrared sensor of the first preferred embodiment and FIG. 2B is an enlarged view of a primary portion of the same.

This infrared sensor preferably includes an infrared sensor element 1, a package 2, and an optical filter 3. The package 2 in which the infrared sensor element is accommodated is made of metal for surface mounting, and has a box-like shape with an opening 2a formed at a surface (an upper surface shown in FIG. 1B) so as to have an inner space (a sealed space) 2b in which the infrared sensor element 1 is accommodated. The package 2 also has a wiring pattern 11 therein. The optical filter 3 covers the entire area of the opening 2a of the package 2. The optical filter 3 provides a function of allowing the infrared sensor element 1 to receive infrared radiation with a predetermined wavelength, and also, a function as a cover to seal the opening 2a of the package 2.

The infrared sensor element 1 preferably is a so-called dual type infrared sensor element having a pyroelectric element 1a polarized in a thickness direction, and two electrodes (light-receiving electrodes) 10a and 10b disposed on a surface of the pyroelectric element 1a. The electrodes 10a and 10b are connected in series to have reversed polarities, so that external noises (e.g., temperature variation of surrounding environment) concurrently input to the two light-receiving electrodes 10a and 10b cancel each other out.

The package 2 has a box-like shape and is preferably made of metal (for example, 42-Ni, phosphor bronze, brass, nickel silver, or iron) with a substantially entire area of an upper surface thereof being open. A portion of the inner side and a portion of the outer side of the package 2 are lined with an insulating material 4, such as glass or LCP resin (liquid crystal polymer). A wiring pattern 11, which is required for the configuration of the infrared sensor, is provided on the surface of the insulating material 4.

The opening 2a of the package 2 preferably has a substantially rectangular profile in plan view. Supporting portions (bases) 12 are disposed on the bottom surface of the package 2, for supporting the infrared sensor element 1. The infrared sensor element 1 is supported on the supporting portions (bases) 12.

A by-pass capacitor 13, an FET 14, and a resistance 15, which are required for the configuration of the infrared sensor, are disposed in the package 2 so as to conduct to electrodes and wiring (not shown).

In the infrared sensor of the first preferred embodiment, outer connection terminals (outer electrodes) 5 are provided at predetermined positions of the package 2 made of metal. The outer connection terminals 5 are insulated by an insulator (e.g., glass in the first preferred embodiment) so as not to conduct to the package 2. Thus, the infrared sensor element 1 disposed in the package 2 is electrically connected to external devices through the wiring pattern provided in the package 2 and the outer connection terminals (outer electrodes) 5.

The optical filter 3 preferably is an optical filter having a resistance of about 1 MΩ/cm or less and made of monocrystal silicon which transmits infrared radiation with a predetermined wavelength. The optical filter 3 preferably has a substantially rectangular shape in plan view that substantially corresponds to the shape of the opening 2a formed at the upper surface of the package 2. The optical filter 3 used in the first preferred embodiment preferably measures approximately 8.8 mm in length (L), 6.8 mm in width (W), and 0.5 mm in thickness (T), for example.

As shown in FIGS. 2A and 2B, grooves 8 (8a, 8b, 8c, 8d) are formed at a peripheral portion of the optical filter 3 in a region opposed to a circumferential region of the opening 2a of the package 2. The grooves 8 extend parallel or substantially parallel to the edges of the optical filter 3. An annular groove 80 continuously located in the peripheral portion of the optical filter 3 is defined by portions (inner portions) of the grooves 8, excluding outer portions (near the edges) of the grooves 8 with respect to the intersections of the grooves 8.

In this preferred embodiment, the grooves 8 are formed by half-cutting the optical filter 3 using a dicing blade with a thickness of about 0.30 mm, for example.

Each groove 8 (80) measures about 0.1 mm in depth (D1) and about 0.30 mm in width (W1, width of the blade), for example. A distance (L1) from an edge of the optical filter 3 to the center in a width direction of the groove 8 (80) is about 0.24 mm, for example.

As shown in FIG. 3, the region of the optical filter 3 including the annular groove 80 at the surface opposed to the opening 2a of the package 2 is mechanically joined to the circumferential region of the opening 2a of the package 2 by a conductive adhesive 7. Accordingly, the opening 2a of the package 2 is reliably sealed with the optical filter 3, and the optical filter 3 is electrically connected to the package 2 reliably via the conductive adhesive 7.

In the infrared sensor with the above-described configuration, the annular groove 80 is formed at the peripheral portion of the optical filter 3 in the region opposed to the circumferential region of the opening 2a of the package 2 to be continuously located in the peripheral portion of the optical filter 3, and the peripheral portion of the optical filter 3 is joined to the circumferential region of the opening 2a of the package 2 by the conductive adhesive 7 held in the annular groove 80 continuously located in the peripheral portion of the optical filter 3. Accordingly, the optical filter 3 is reliably connected to the package 2 mechanically and electrically.

Since a reliability of joining the optical filter 3 to the package 2 is enhanced without requiring a complicated structure or a complicated manufacturing procedure, and the infrared sensor element 1 is accommodated in the sealed space 2b defined by the electrically connected optical filter 3 and package 2, the infrared sensor having a high electromagnetic-shielding performance and a reliable electromagnetic-wave-proof characteristic can be provided.

Also, in the infrared sensor of the first preferred embodiment, since the annular groove 80 continuously located in the peripheral portion of the optical filter 3 holds the conductive adhesive 7, the conductive adhesive 7 can be prevented from flowing to a central region from the peripheral portion of the optical filter 3, thereby providing a sufficient field of view and a high detection reliability.

In the first preferred embodiment, the optical filter body of the optical filter 3 is preferably made of a low-resistance material. However, even when the optical filter body is made of an insulating material, the optical filter 3 can be reliably joined to the package 2 without requiring a complicated manufacturing procedure, and also the conductive adhesive 7 can be restricted and prevented from flowing to the central region from the peripheral portion of the optical filter 3, thereby providing the sufficient field of view (namely, infrared radiation with a predetermined wavelength can be reliably transmitted through the central region). Therefore, the infrared sensor with a high reliability can be provided, which is one of the principal advantages achieved by preferred embodiments of the present invention.

The present invention may be applied to various optical filters regardless of the configuration of the optical filter. For example, the present invention may be applied to any of the following cases:

(1) a case where an optical filter is made of a low-resistance material (the case of the first preferred embodiment);

(2) a case where an optical filter is formed such that a low-resistance material (layer) is arranged on the surface of a filter body (layer) made of an insulating material;

(3) a case where an optical filter is formed such that a low-resistance material (layer) is arranged on the surface of a filter body (layer) made of a low-resistance material; and (4) a case where an optical filter is formed such that an insulating material (layer) is arranged on the surface of a filter body (layer) made of a low-resistance material (the case of a second preferred embodiment described below).

In the infrared sensor of the first preferred embodiment, since the package 2 has the wiring pattern 11, wiring patterns required to be formed at other members may be reduced, thereby reducing the size of a product and reducing the number of components.

Since the optical filter 3 can be joined to the package 2 without other components interposed therebetween, the size of the product can be reduced and the manufacturing procedure can be simplified, thereby reducing the cost.

Since the package 2 has the supporting portions (bases) 12 for supporting the infrared sensor element 1, additional supporting members are not required, and thus, the number of components can be reduced and the size of the product can be reduced.

Since the bottom of the package 2 serves as a stem of the infrared sensor in a manner similar to the known infrared sensor, the size of the product can be further reduced.

Second Preferred Embodiment

Figure 4A:
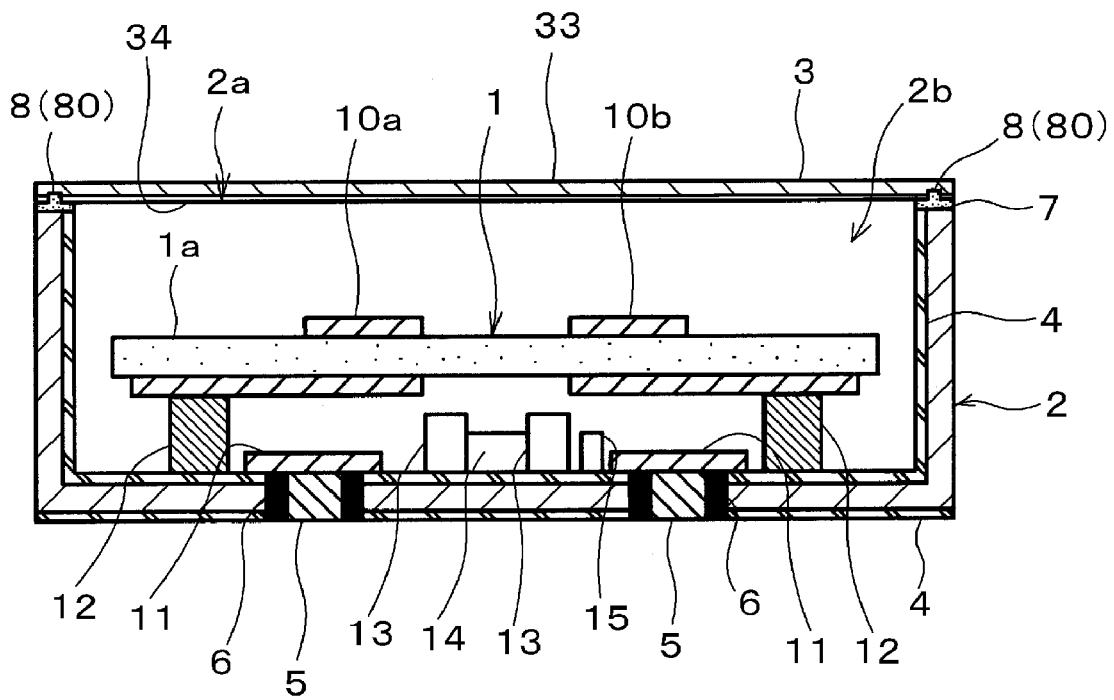
FIG. 4A is a cross-sectional view schematically showing an infrared sensor according to a second preferred embodiment of the present invention and FIG. 4B is a perspective view of the same.
Figure 4B:
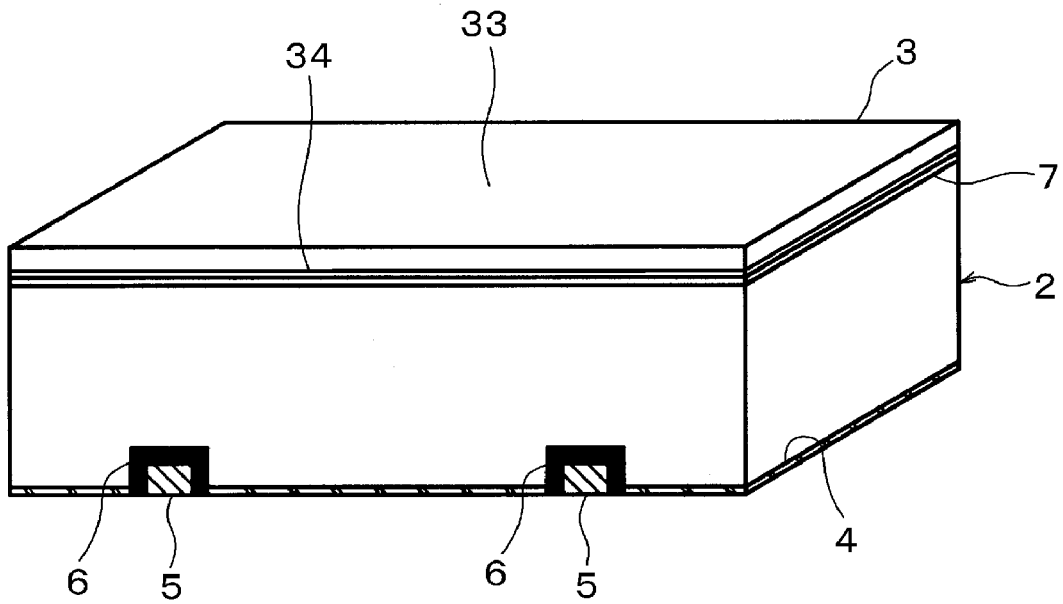
Figure 5A:
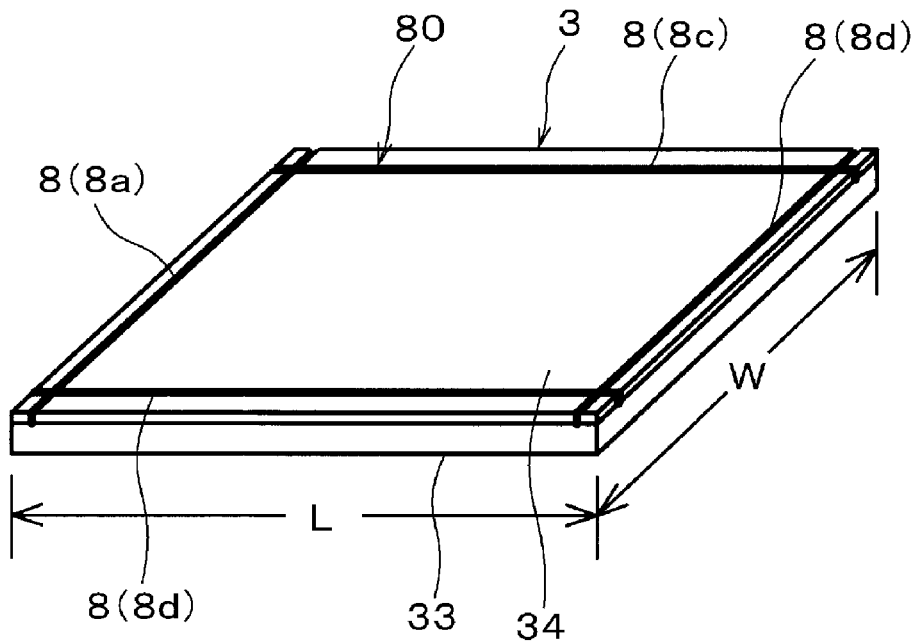
FIG. 5A is a perspective view showing a configuration of an optical filter used for the infrared sensor of the second preferred embodiment and FIG. 5B is an enlarged view of a primary portion of the same.
Figure 5B:
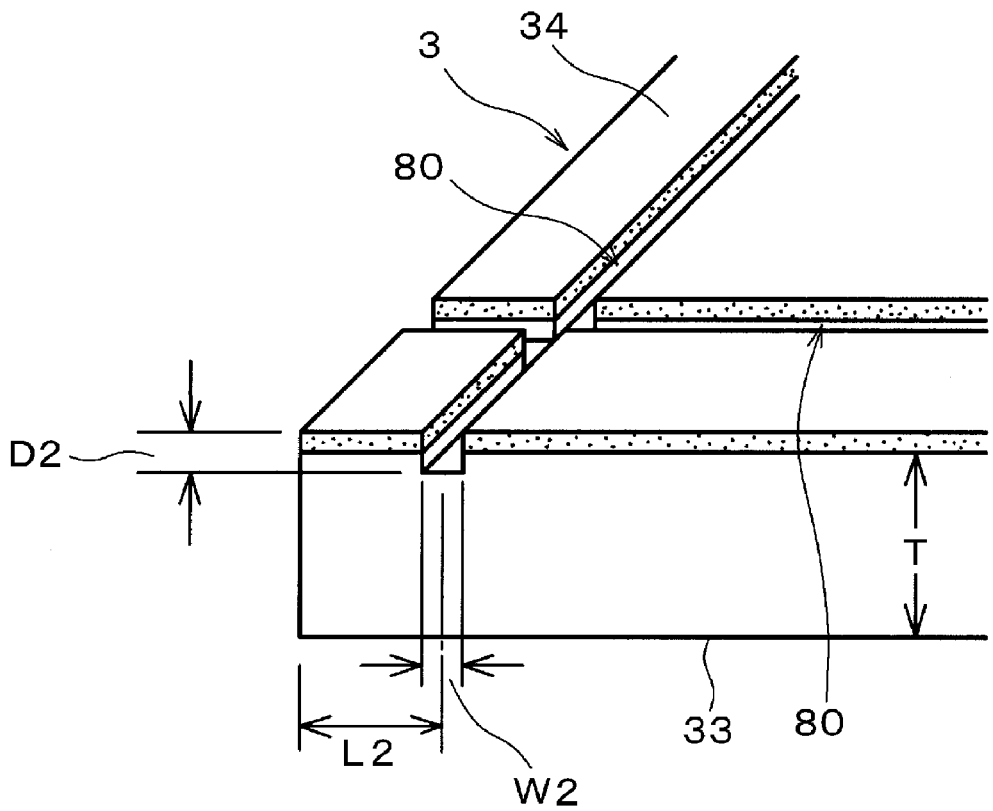
Figure 6:
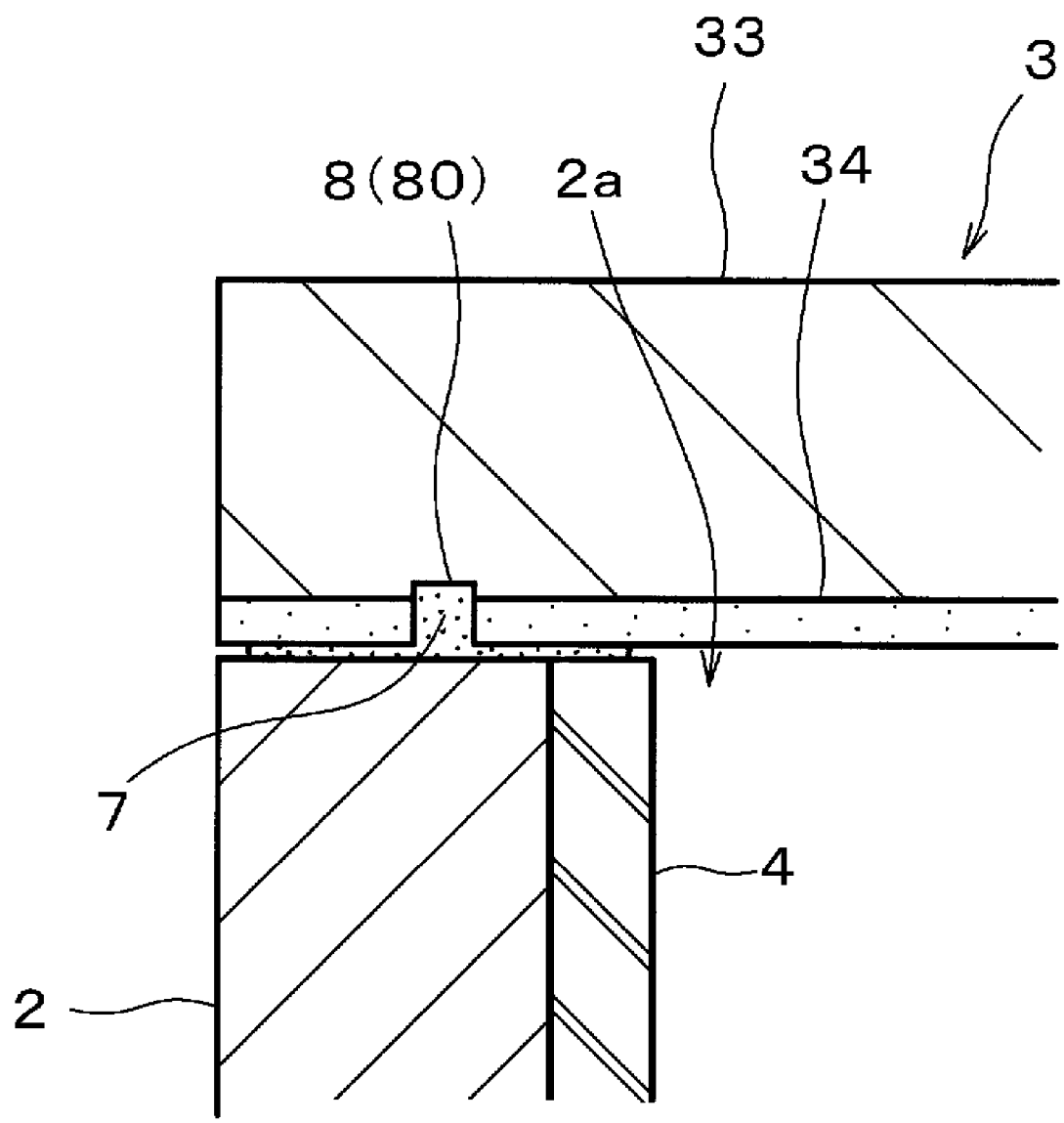
FIG. 6 is an illustration showing an essential structure of the infrared sensor according to the second preferred embodiment of the present invention.

FIG. 4A is a cross-sectional view schematically showing an infrared sensor according to a second preferred embodiment of the present invention and FIG. 4B is a perspective view of the same. FIG. 5A is a perspective view showing a configuration of an optical filter used for the infrared sensor of the second preferred embodiment and FIG. 5B is an enlarged view of a primary portion of the same.

The infrared sensor of the second preferred embodiment has the following configurations.

(a) The optical filter 3 preferably has a two-layer structure composed of a filter body 33 and a thin film 34. The filter body 33 preferably has a resistance of about 1 MΩ/cm or less and transmits infrared radiation with a predetermined wavelength. The thin film 34 is made of an insulating material and provided by depositing on a surface (a lower surface shown in FIG. 4B) to be joined to the circumferential region of the opening 2a formed at the package 2.

(b) The annular groove 80 is formed at the surface provided with the thin film 34 made of the insulating material in the region opposed to the circumferential region of the opening 2a of the package 2 to be continuously located in the peripheral portion of the optical filter 3. The annular groove 80 has a depth (D2) (shown in FIG. 5B) extending from the surface provided with the thin film 34 to the filter body 33.

The above-mentioned configurations are different from those of the first preferred embodiment. However, other configurations preferably are similar to those of the infrared sensor of the first preferred embodiment.

In the second preferred embodiment, it is assumed that W2 represents the width of the groove formed at the optical filter 3, and L2 represents a distance from the edge of the optical filter 3 to the center in the width direction of the groove 8 (80).

Similar reference numerals in FIGS. 4A and 4B, FIGS. 5A and 5B, and FIG. 6 refer to similar or corresponding components as shown in FIGS. 1A and 1B, FIGS. 2A and 2B, and FIG. 3.

In the infrared sensor of the second preferred embodiment, as shown in FIGS. 4A and 4B, FIGS. 5A and 5B, and FIG. 6, the annular groove 80 is formed at the peripheral portion of the optical filter 3, at the surface provided with the thin film 34 made of the insulating material in the region opposed to the circumferential region of the opening 2a of the package 2 to be continuously located in the peripheral portion of the optical filter 3. The thickness of which extends from the surface provided with the thin film 34 made of the insulating material to the filter body 33. Accordingly, the peripheral portion of the optical filter 3 can be reliably joined to the circumferential region of the opening 2a of the package 2 by the conductive adhesive 7 held in the annular groove 80 formed at the optical filter 3, in a manner similar to the infrared sensor of the above-described first preferred embodiment.

In the infrared sensor of the second preferred embodiment, the optical filter 3 has the thin film 34 made of the insulating material at the surface of the optical filter 3. In this case, since the annular groove 80 is arranged to extend from the surface provided with the thin film 34 made of the insulating material to the filter body 33, the optical filter 3 can be electrically reliably connected to the package 2 by the conductive adhesive 7 held in the annular groove 80. Thus, the infrared sensor element 1 is accommodated in the sealed space 2b defined by the optical filter 3 and the package 2 which are electrically connected to each other, thereby providing an infrared sensor having a high electromagnetic-shielding performance.

Also, in the infrared sensor of the second preferred embodiment, since the conductive adhesive 7 is held at the annular groove 80 formed to be continuously located in the peripheral portion of the optical filter 3, the conductive adhesive 7 can be prevented from flowing to the central region from the peripheral portion of the optical filter 3, thereby providing a sufficient field of view and a high detection reliability.

In the infrared sensor of the second preferred embodiment, other advantages similar to those of first preferred embodiment are achieved. In particular, since the package 2 has the wiring pattern 11, wiring patterns required to be provided at other members may be reduced, thereby reducing the size of the product and the number of components. Also, since the optical filter 3 can be joined to the package 2 without other components interposed therebetween, the size of the product can be reduced and the manufacturing procedure can be simplified, thereby reducing the cost. Further, since the package 2 has the supporting portions (bases) 12 for supporting the infrared sensor element 1, additional supporting members are not required, and thus, the number of components can be reduced and the size of the product can be reduced.

In the first and second preferred embodiments, while the infrared sensor element preferably is the dual type using the pyroelectric elements, the infrared sensor element of the present invention is not limited to that type, and may be single type or quad type, or the present invention may be applied to an infrared sensor using various types of infrared sensor elements such as a thermopile and a photodiode.

Third Preferred Embodiment

Figure 7:
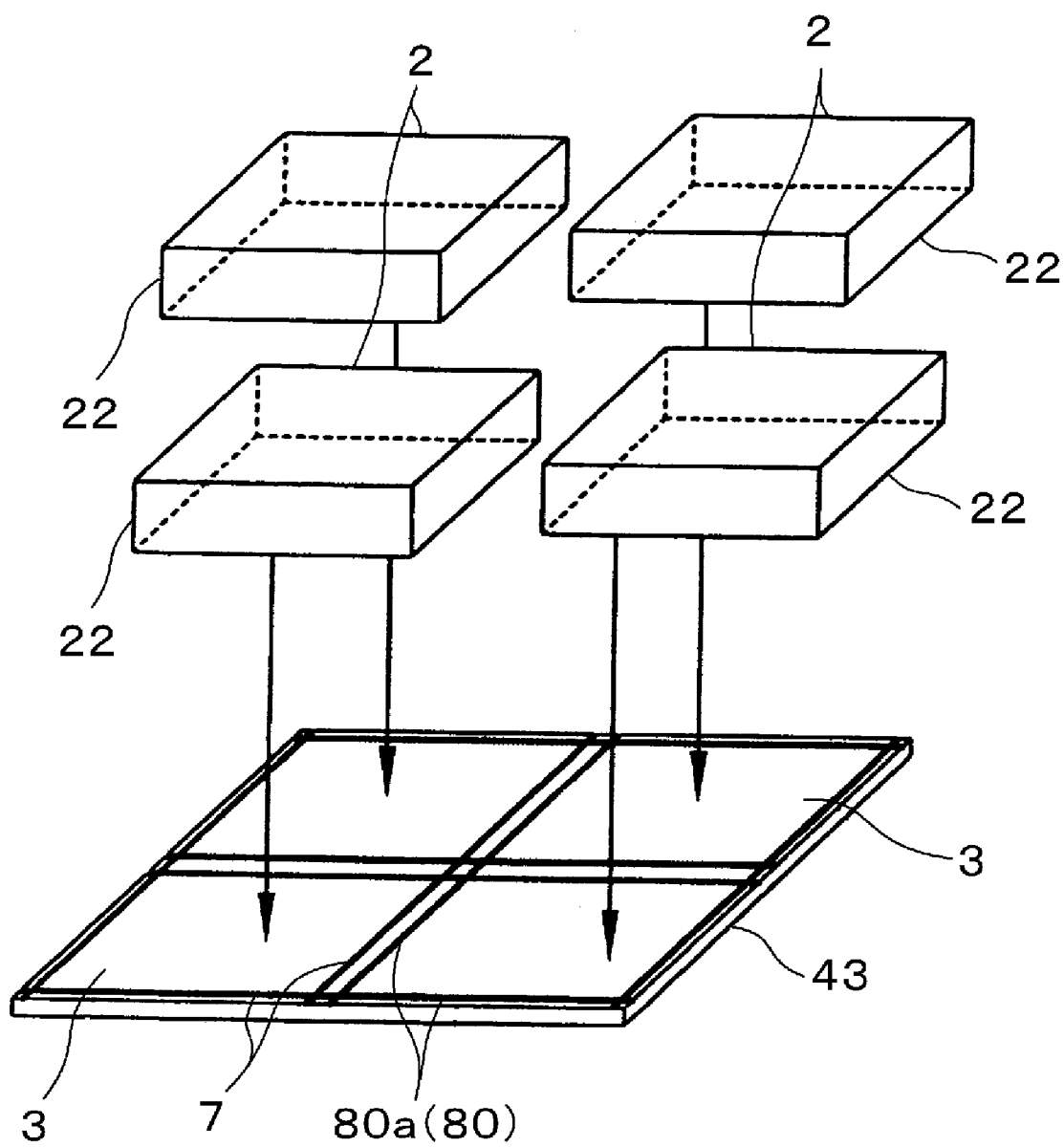
FIG. 7 is an illustration showing a procedure of manufacturing an infrared sensor according to a third preferred embodiment of the present invention.
Figure 8:
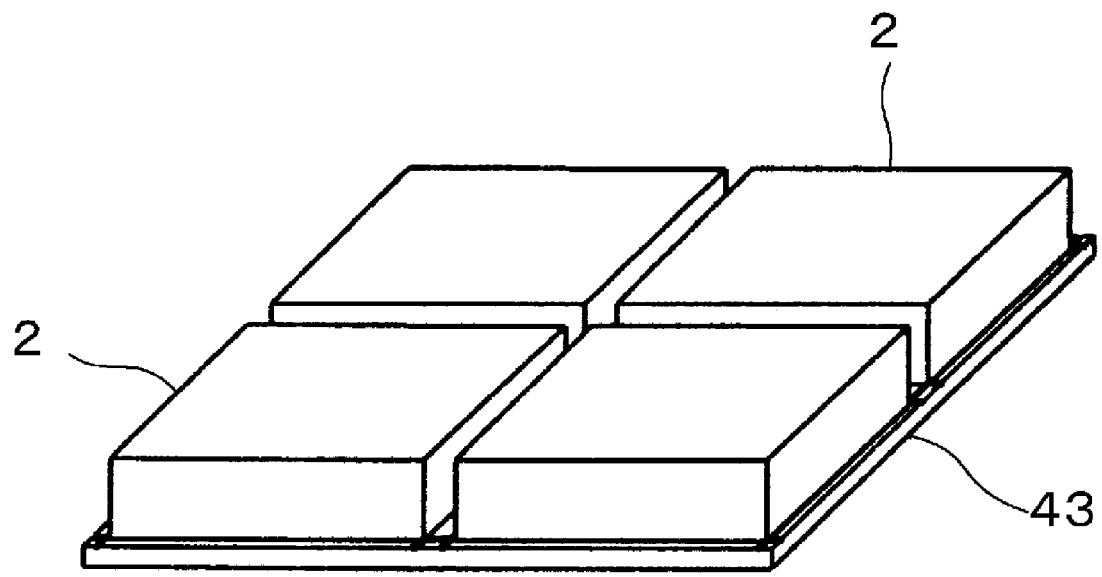
FIG. 8 is an illustration showing another procedure of manufacturing the infrared sensor according to the third preferred embodiment of the present invention.
Figure 9:
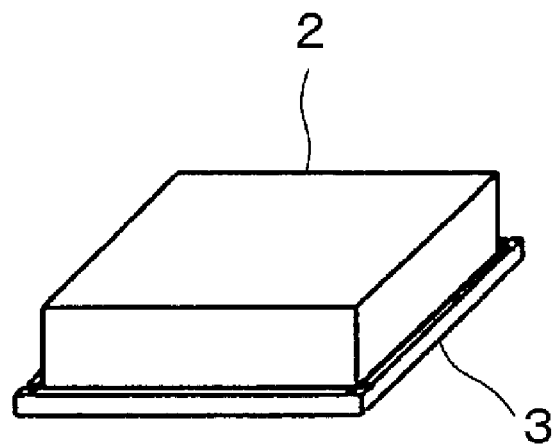
FIG. 9 is an illustration showing still another procedure of manufacturing the infrared sensor according to the third preferred embodiment of the present invention.

FIGS. 7 to 9 are illustrations showing a method of manufacturing the infrared sensor according to a third preferred embodiment of the present invention. In the third preferred embodiment, the method corresponds to the manufacturing method of the infrared sensor described in the first preferred embodiment.

The method of manufacturing the infrared sensor according to the third preferred embodiment relates to a method of manufacturing an infrared sensor in which a plurality of packages that accommodate infrared sensor elements are disposed on a mother optical filter, and the plurality of packages are bonded and fixed thereto and then divided into individual infrared sensors, thereby manufacturing a plurality of infrared sensors at one time.

In the method of the third preferred embodiment, for example, as shown in FIG. 7, grooves 80a which become grooves 80 continuously located in peripheral portions of optical filters 3 after being divided are formed at a mother optical filter 43 which contains the optical filters 3 corresponding to the plurality of infrared sensors.

The conductive adhesive 7 is applied to the grooves 80a which become the grooves 80 continuously located in the peripheral portions of the optical filters 3 and to the vicinities of the grooves 80a.

As shown in FIG. 8, the plurality of packages 2 that accommodate the infrared sensor elements are placed on the mother optical filter 43 such that the circumferential regions of the openings of the packages 2 come into contact with the conductive adhesive 7 applied at the grooves 80a and the vicinities thereof.

The plurality of packages 2 are bonded and fixed to the mother optical filter 43 by curing the conductive adhesive 7.

The mother optical filter 43 is divided at predetermined positions to obtain the individual infrared sensors (FIG. 9).

With the method of the third preferred embodiment, the plurality of infrared sensors can be manufactured efficiently at one time.

Fourth Embodiment

Figure 10A:
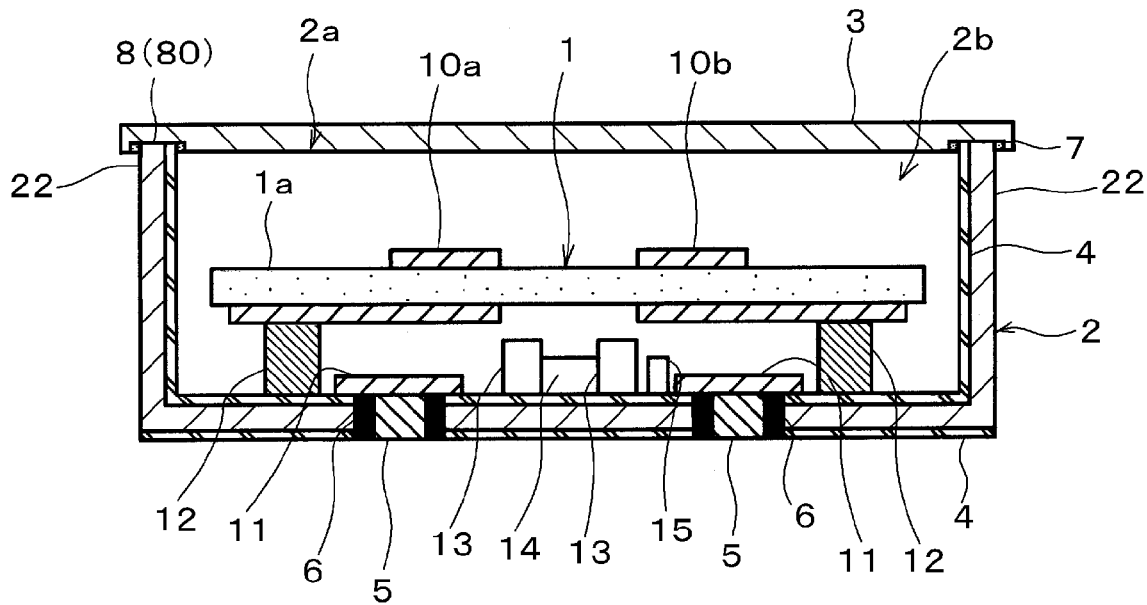
FIG. 10A is a cross-sectional view schematically showing an infrared sensor according to a fourth preferred embodiment of the present invention and FIG. 10B is a perspective view of the same.
Figure 10B:
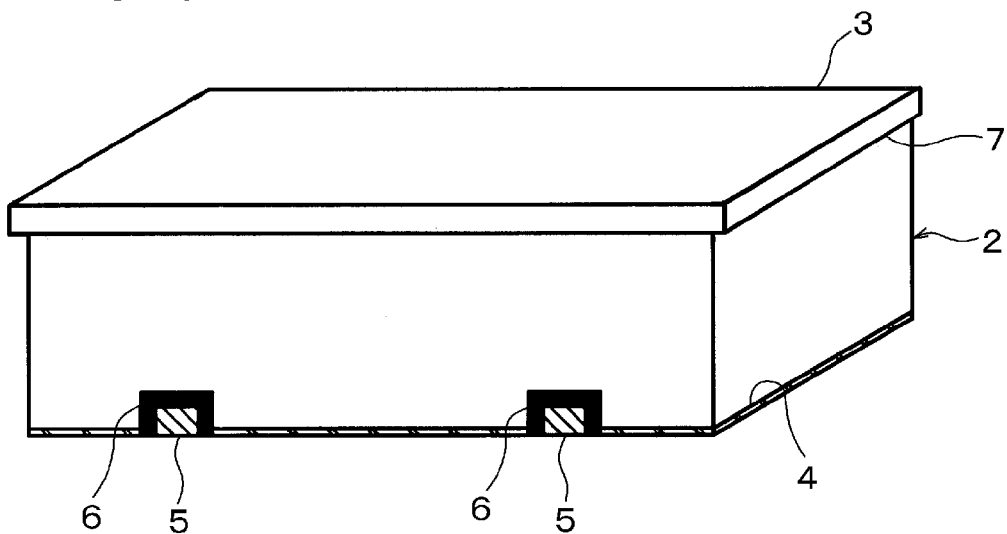
Figure 11A:
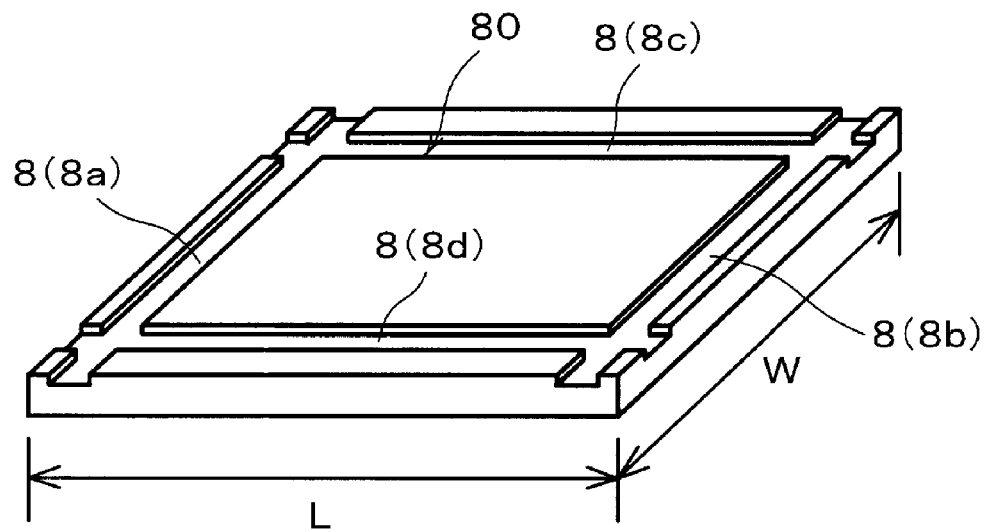
FIG. 11A is a perspective view showing a configuration of an optical filter used for the infrared sensor of the fourth preferred embodiment and FIG. 11B is an enlarged view of a primary portion of the same.
Figure 11B:
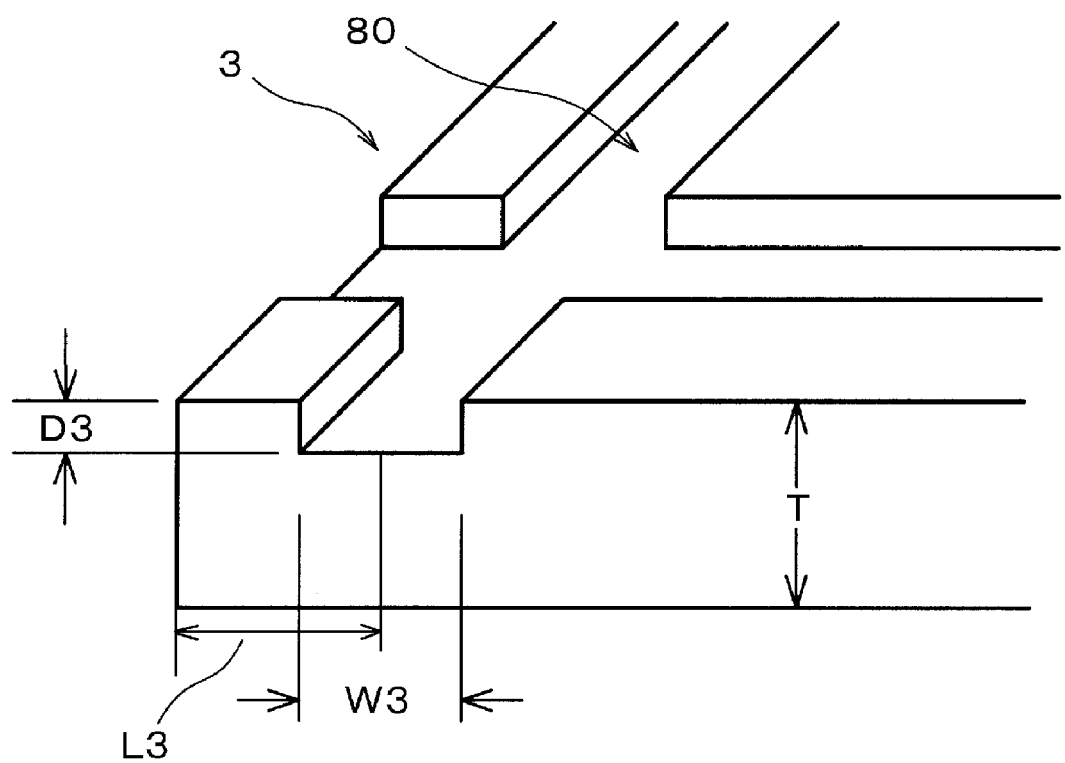
Figure 12:
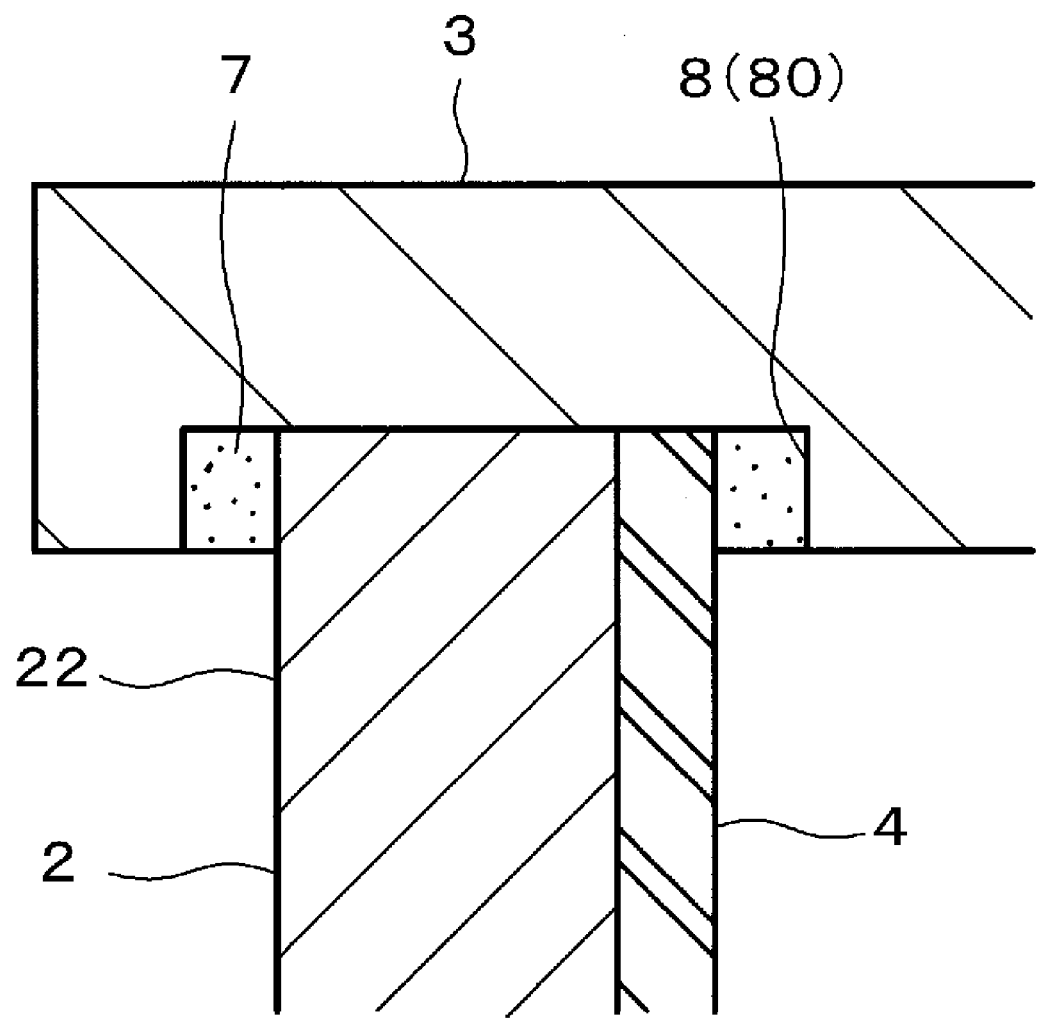
FIG. 12 is an illustration showing an essential structure of the infrared sensor according to the fourth preferred embodiment of the present invention.

FIG. 10A is a cross-sectional view schematically showing an infrared sensor according to a fourth preferred embodiment of the present invention and FIG. 10B is a perspective view of the same. FIG. 11A is a perspective view showing a configuration of an optical filter used for the infrared sensor of the fourth preferred embodiment and FIG. 11B is an enlarged view of a primary portion of the same. FIG. 12 is an illustration showing a state where the circumferential region of the opening of the package is fitted to the grove continuously located in the peripheral portion of the optical filter.

As shown in FIGS. 10A to 12, in the infrared sensor of the fourth preferred embodiment, the circumferential region (an end portion) 22 of the opening 2a of the package 2 is fitted to the annular groove 80 defined by the grooves 8a, 8b, 8c to be continuously located in the peripheral portion of the optical filter 3, and 8d. The end portion 22 of the package 2 is fixed to the groove 80 of the optical filter 3 by the conductive adhesive 7.

In the infrared sensor of the fourth preferred embodiment, the annular groove 80 is formed to be larger than the circumferential region (the end portion) 22 of the package 2 such that the width of the groove 80 is larger than the width of the circumferential region (the end portion) 22 of the package 2. Thus, when the package 2 is placed on the optical filter 3, the circumferential region (the end portion) 22 is fitted to the groove 80 of the optical filter 3.

Each groove 8 (80) measures about 0.1 mm in depth (D3) and about 0.04 mm in width (W3, width of the blade), for example. A distance (L3) from the edge of the optical filter 3 to the center in the width direction of the groove 8 (80) is about 0.24 mm, for example.

Other configurations are similar to those of the first preferred embodiment.

Similar reference numerals in FIGS. 10A and 10B, FIGS. 11A and 11B, and FIG. 12 refer similar or corresponding components as shown in FIGS. 1A and 1B, FIGS. 2A and 2B, and FIG. 3.

As described above, since the infrared sensor of the fourth preferred embodiment has the configuration in which the circumferential region (the end portion) 22 of the opening 2a of the package 2 is fitted to the groove 80 continuously located in the peripheral portion of the optical filter 2, when the optical filter 3 is mounted on the package 2, the positional accuracy can be enhanced, and the positional shift of the optical filter 3 can be prevented after mounting, thereby providing a highly reliable infrared sensor.

In other configurations of the infrared sensor of the fourth preferred embodiment, advantages similar to those obtained by the infrared sensor of the first and second preferred embodiments can be obtained.

In the infrared sensor of the fourth preferred embodiment, in a manner similar to the second preferred embodiment, the optical filter having the two-layer structure that is composed of the filter body and the thin film made of the insulating material may be used as the optical filter 2.

Fifth Preferred Embodiment

Figure 13:
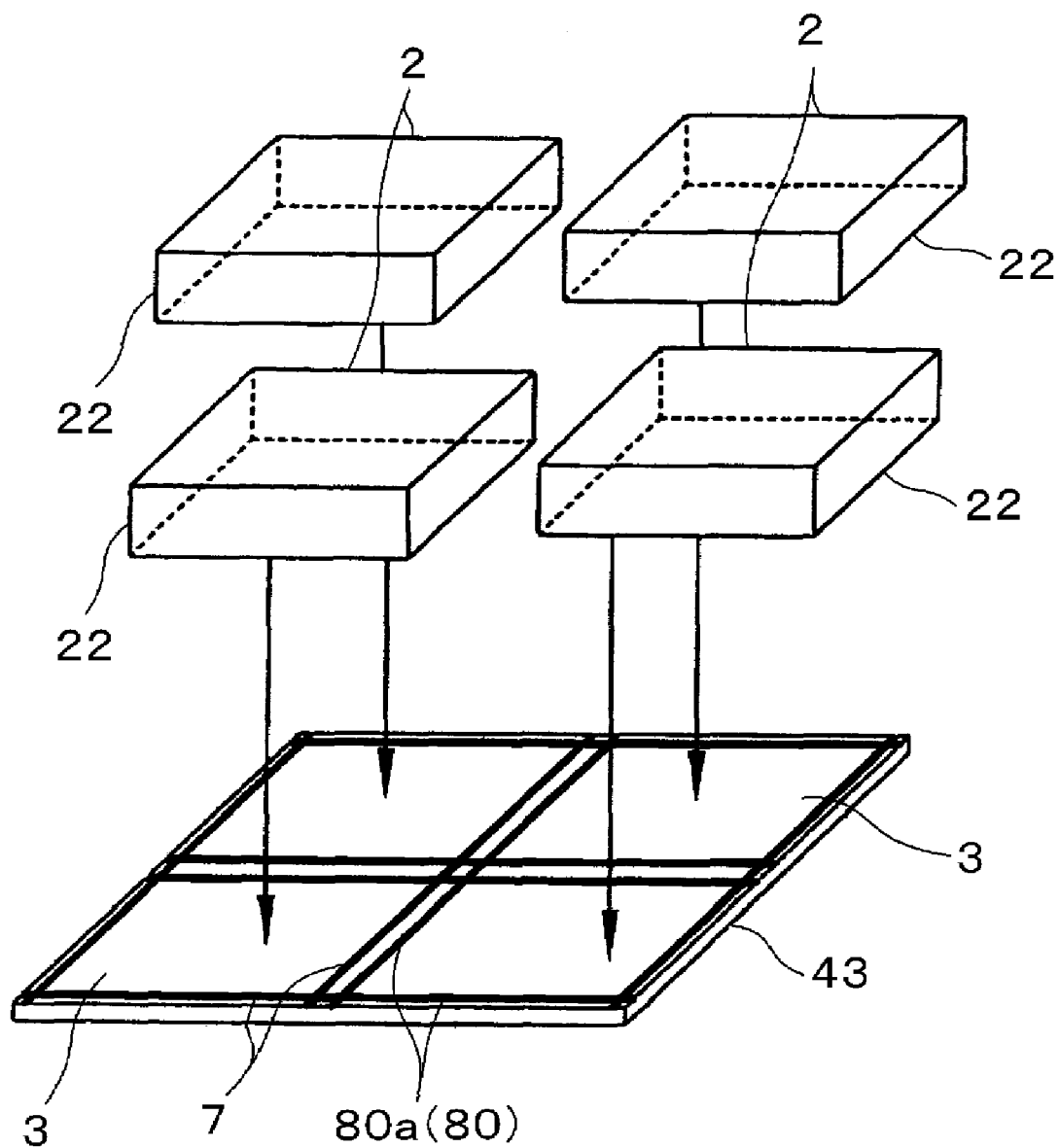
FIG. 13 is an illustration showing a procedure of manufacturing an infrared sensor according to a fifth preferred embodiment of the present invention.
Figure 14:
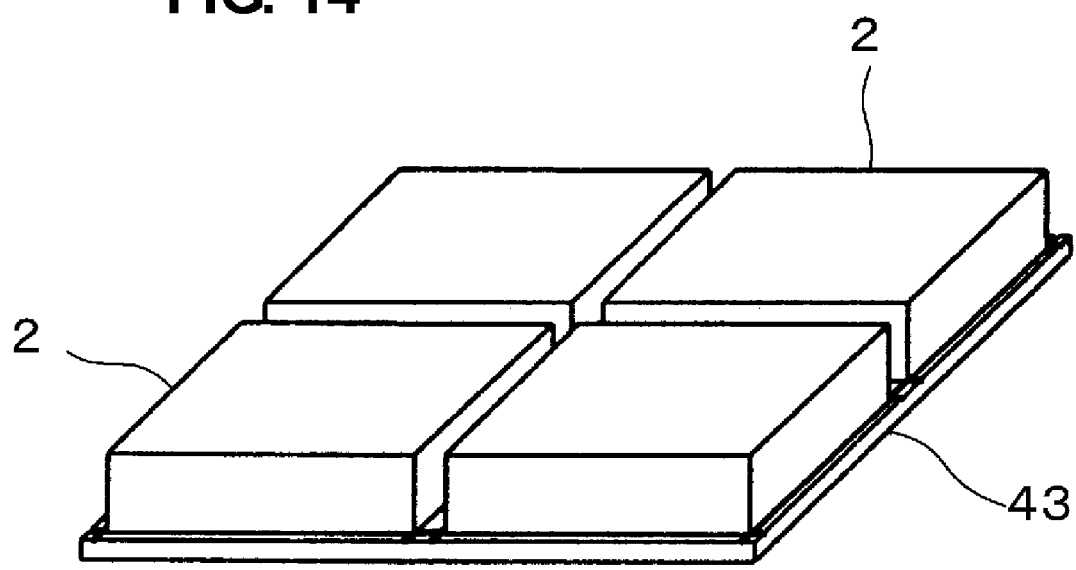
FIG. 14 is an illustration showing another procedure of manufacturing the infrared sensor according to the fifth preferred embodiment of the present invention.
Figure 15:
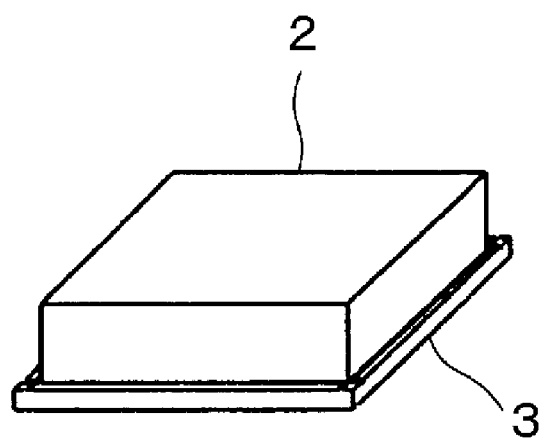
FIG. 15 is an illustration showing still another procedure of manufacturing the infrared sensor according to the fifth preferred embodiment of the present invention.
Figure 16A:
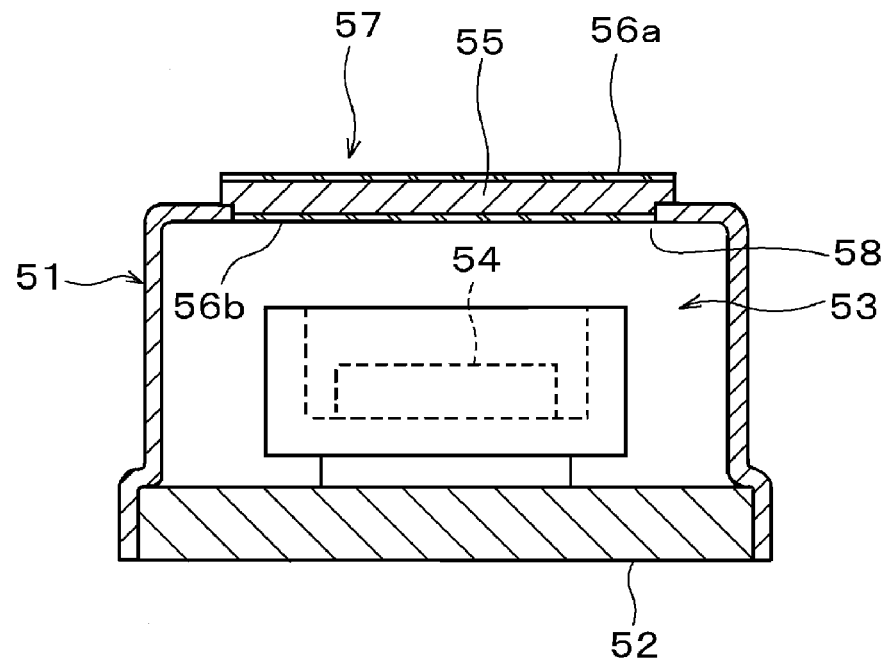
FIGS. 16A and 16B are illustrations each showing a configuration of a known infrared sensor.
Figure 16B:
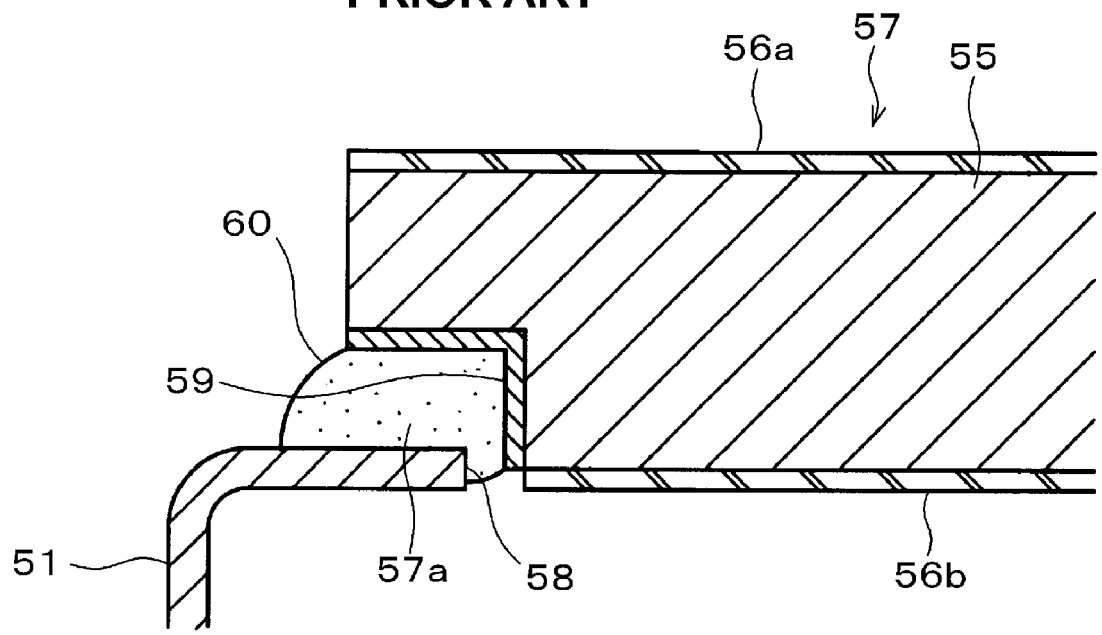
Figure 17:
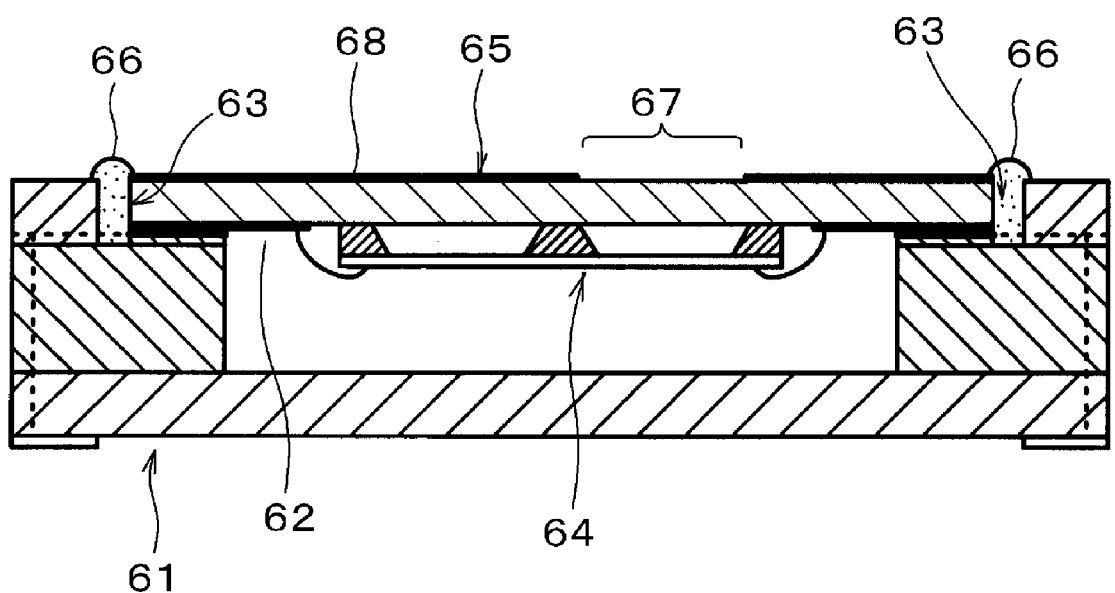
FIG. 17 is an illustration showing a configuration of another known infrared sensor.

FIGS. 13 to 15 are illustrations showing a method of manufacturing the infrared sensor according to a fifth preferred embodiment of the present invention. In the fifth preferred embodiment, the method corresponds to the manufacturing method of the infrared sensor described in the fourth preferred embodiment.

The method of manufacturing the infrared sensor according to the fifth preferred embodiment relates to a method of manufacturing an infrared sensor in which a plurality of packages that accommodate infrared sensor elements are disposed on a mother optical filter, and the plurality of packages are bonded and fixed thereto and then divided into individual infrared sensors, thereby manufacturing a plurality of infrared sensors at one time.

In the method of the fifth preferred embodiment, for example, as shown in FIG. 13, grooves 80a which become grooves 80 continuously located in peripheral portions of optical filters 3 after being divided are formed at the mother optical filter 43 including the optical filters 3 corresponding to the plurality of infrared sensors.

In this case, the grooves 80a are formed to have a width that allows the circumferential regions (the end portions) 22 of the openings 2a of the packages 2 to be fitted to the grooves 80a.

Then, the conductive adhesive 7 is applied to the grooves 80a which become the grooves 80 continuously located in the peripheral portions of the optical filters 3.

As shown in FIG. 14, the plurality of packages 2 that accommodate the infrared sensor elements are placed on the mother optical filter 43 such that the circumferential regions of the openings of the packages 2 are fitted to the grooves 80a and come into contact with the conductive adhesive 7 applied at the grooves 80a.

The plurality of packages 2 are bonded and fixed to the mother optical filter 43 by curing the conductive adhesive 7.

The mother optical filter 43 is divided at predetermined positions to obtain the individual infrared sensors (FIG. 15).

With the method of the fifth preferred embodiment, the plurality of infrared sensors can be manufactured efficiently at one time.

In the case of the method of manufacturing the infrared sensor according to the fifth preferred embodiment, the packages 2 are placed on the mother optical filter 43 such that the circumferential regions (the end portions) 22 of the openings 2a of the packages 2 are fitted to the grooves 80a that become the grooves continuously located in the peripheral portions of the optical filters. Therefore, the positional shift may be reduced. Thus, not only the adhesive can be applied before the packages 2 are mounted, but also the adhesive can be applied after the packages 2 are mounted and then the packages 2 may be bonded and fixed to the mother optical filter 43. This may allow the manufacturing procedure to be designed freely, and to be rationalized.

While the optical filter preferably is made of monocrystal silicon in the first to fifth preferred embodiments, it is not limited to the monocrystal silicon. For example, the optical filter body may be made of various materials that transmit infrared radiation, such as quartz, sapphire, barium fluoride, and spinel.

In the case where the filter body is made of an insulator such as quartz, a metal film is deposited on the surface of the body so as to be conductive.

Other configurations of the present invention are not limited to those described in the first to fifth preferred embodiments, and various applications and modifications may be made for the structure and shape of the package, the type of the adhesive (the conductive adhesive) for joining the optical filter to the package, and the like, within the scope of the present invention.

Accordingly, with the above-described preferred embodiments of the present invention, the adhesive may be prevented from flowing to an unwanted region of the optical filter and reducing the field of view, and also, the optical filter may be reliably joined to the package without requiring a complicated structure or a complicated manufacturing procedure.

Also, with the preferred embodiments of the present invention, the configuration may be easily and reliably provided that the infrared sensor element is accommodated in the sealed space defined by the optical filter and the package electrically connected to each other, thereby having a high electromagnetic-shielding performance.

Therefore, preferred embodiments of the present invention may be applied to general purpose infrared sensors used for human detection, security apparatuses, and the like.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An infrared sensor comprising:
    an infrared sensor element;
    a package arranged to be surface mounted and having a substantially box shaped configuration with an opening formed at a surface, the package being configured to accommodate the infrared sensor element therein; and
    an optical filter configured to transmit infrared radiation with a predetermined wavelength, the optical filter being arranged to cover the opening of the package, a peripheral portion of the optical filter being joined to a circumferential region of the opening of the package by an adhesive, the optical filter being arranged to allow the infrared sensor element to receive the infrared radiation with the predetermined wavelength and to define a cover sealing the opening; wherein
    a plurality of grooves are located at the peripheral portion of the optical filter in a region opposed to the circumferential region of the opening of the package so as to be continuously located in the peripheral portion of the optical filter;
    the optical filter is disposed on an uppermost surface of the package; and
    an end of at least one of the plurality of grooves extends to and is exposed at an edge of the optical filter.

2. The infrared sensor according to claim 1, wherein the optical filter has a resistance of about 1 MΩ/cm or less, the package is mainly composed of a metal material, the adhesive is a conductive adhesive, and the optical filter is electrically connected to the package with the conductive adhesive interposed therebetween.

3. The infrared sensor according to claim 1, wherein the optical filter has a filter body and a thin film, the filter body being arranged to allow the infrared sensor element to receive the infrared radiation with the predetermined wavelength and to define a cover sealing the opening, the thin film being made of an insulating material and provided on a surface of the filter body, and the groove continuously located in the peripheral portion of the optical filter extends from the surface provided with the thin film made of the insulating material to the filter body.

4. The infrared sensor according to claim 1, wherein the circumferential region of the opening of the package is fitted to the groove continuously located in the peripheral portion of the optical filter.

5. A method of manufacturing the infrared sensor of claim 4, the method comprising the steps of:
    forming a plurality of grooves at a mother optical filter that includes a plurality of the optical filters corresponding to a plurality of the infrared sensors, the grooves becoming a plurality of the grooves continuously located in a plurality of the peripheral portions of the optical filters after being divided;
    placing a plurality of the packages that accommodate a plurality of the infrared sensor elements on the mother optical filter such that a plurality of the circumferential regions of a plurality of the openings are fitted to the grooves that become the grooves continuously located in the peripheral portions of the optical filters, and in this state, bonding and fixing the packages to the mother optical filter by the adhesive; and
    dividing the mother optical filter at predetermined positions so as to obtain the individual infrared sensors.

6. A method of manufacturing the infrared sensor of claim 1, the method comprising the steps of:
    forming a plurality of grooves at a mother optical filter that includes a plurality of the optical filters corresponding to the plurality of infrared sensors, the grooves becoming a plurality of the grooves continuously located in a plurality of the peripheral portions of the optical filters after being divided;
    applying the adhesive at the grooves and vicinities thereof;
    placing a plurality of the packages that accommodate a plurality of the infrared sensor elements on the mother optical filter such that a plurality of the circumferential regions of a plurality of the openings come into contact with the adhesive applied at the grooves and the vicinities thereof, and bonding and fixing the packages to the mother optical filter by the adhesive; and
    dividing the mother optical filter at predetermined positions so as to obtain the individual infrared sensors.

7. The infrared sensor according to claim 1, wherein outer dimensions of the optical filter are substantially the same as outer dimensions of the package.

* * * * *